United States Patent [19]
Iwaki

[11] Patent Number: 5,841,716
[45] Date of Patent: Nov. 24, 1998

[54] STATIC TYPE SEMICONDUCTOR MEMORY DEVICE HAVING A DIGIT-LINE POTENTIAL EQUALIZATION CIRCUIT

[75] Inventor: Hiroaki Iwaki, Tokyo, Japan

[73] Assignee: NEC Corporation, Tokyo, Japan

[21] Appl. No.: 934,854

[22] Filed: Sep. 22, 1997

[30] Foreign Application Priority Data

Sep. 26, 1996 [JP] Japan ................................. 8-254434

[51] Int. Cl.⁶ .................................................. G11C 7/00
[52] U.S. Cl. ........................ 365/203; 365/233; 365/205; 365/207
[58] Field of Search .................... 365/203, 233, 365/205, 207

[56] References Cited

U.S. PATENT DOCUMENTS 5,337,271  8/1994  Kawahara et al. ...................... 365/203
5,349,560  9/1994  Suh et al. ................................ 365/203

FOREIGN PATENT DOCUMENTS 2-146183  6/1990  Japan .

*Primary Examiner*—Vu A. Le
*Attorney, Agent, or Firm*—Whitham, Curtis & Whitham

[57] ABSTRACT

A semiconductor memory device includes precharging circuit for supplying a current to selected digit line pair and equalizing circuit for equalizing potential of complementary digit lines forming all of digit line pairs. Only digit line pair selected by a column address input signal is precharged by the precharging circuit. The potentials of the complementary digit lines forming all digit line pairs is equalized respectively by the equalizing circuit after precharging operation.

6 Claims, 13 Drawing Sheets

STATIC TYPE SEMICONDUCTOR MEMORY DEVICE HAVING A DIGIT-LINE POTENTIAL EQUALIZATION CIRCUIT

BACKGROUND OF THE INVENTION

1. Field of the Invention

The present invention relates to a static type semiconductor memory device which can be stabilized in operation.

2. Description of The Prior Art

In general, a static random access memory (SRAM) as a semiconductor memory device, is capable of higher speed operation in comparison with a dynamic random access memory (DRAM) because it does not require refreshing operation. Also, since it is easy to design operation timing of SRAM, it is frequently mounted even in Application Specific ICs (ASICS) which are required high speed system operation and designing in short period.

FIG. 1 is a block diagram showing an example of construction of the conventional synchronous single port SRAM.

Hereinafter, this will be referred to as "first prior art". The SRAM has a construction of m words×n bits, p columns (m, n and p are natural numbers). Namely, the SRAM has n in number of function blocks 180 with taking one bit as one unit, an address latch 130, a row decoder 121 for determining selection of word lines, a column decoder 141 for determining selection of a digit line pair and a precharge driver 102. On the other hand, the function block 180 includes RAM cell block 120, column selector units 140 for selecting one set of digit line pair among p sets of digit line pairs, precharger unit 100, sense amplifier 150 and write driver 151. Each RAM cell block 120 is constructed with digit line pairs, word lines and a plurality of RAM cells arranged in matrix fashion of p×(m/p).

A clock signal CLK is input to an address latch 130, the column decoder 141, and sense amplifiers 150 and write drivers 151 in the function blocks 180. An address signal AD is input to the address latch 130, the precharge driver 102 and row decoder 121. A signal output from the address latch 130 is input to the row decoder 121 and the column decoder 141. A word line signal WLS output from the row decoder 121 is a signal selecting the word line and is input the RAM cell block 120 in the function block 180.

A precharge control signal PC output from the precharge driver 102 is input to respective precharger units 100 in the function block 180. Column address input signals SEL[1:p] output from the column decoder 141 are input to respective column selector units 140 in the function blocks 180. Also, a write enable bar signal WEB is input to respective sense amplifiers 150 and respective write drivers 151 of the function blocks 180.

In the function block 180, a write data input signal IN is input to the RAM cell block 120 via the write driver 151 and the column selector unit 140. On the other hand, a read out data output signal OUT is externally output from the RAM cell block 120 via the column selector unit 140 and sense amplifier 150. The precharger unit 100 supplies current to the digit line pairs so that the digit line pairs of the RAM cell block 120 are precharged corresponding to a signal input from the precharge driver 102.

Operation of the SRAM constructed as set forth above will be discussed hereinafter. FIG. 2 is a chart showing waveforms of an example of operation of the SRAM of the first prior art. In FIG. 2, the clock signal CLK, the address signal ADj, the write enable bar signal WEB and the write data input signal IN[i] are shown as input signals. As an output signal, the read out data output signal OUT[i] is shown. Also, as internal signals, the precharge control signal PC and a word line signal WLS[k] are shown.

In the address signal Adj, j shows an integer satisfying $1 \leq j \leq ([\log_2 (m)]+1)$, and [u] is an integer not exceeding u. On the other hand, the data input signal IN[i] represents an input signal input to the (i)th column of the function block 180 among a plurality of function blocks 180 arranged in column. Also, the data output signal OUT[i] represents an output signal output from the (i)th column of the function block 180. Here, i is an integer satisfying $1 \leq i \leq n$. The word line signal WLS[k] is a signal transmitted to a (k)th row of word line among word lines arranged in row within the RAM cell block 120. Here, k is an integer satisfying $1 \leq k \leq (m/p)$.

On the other hand, in FIG. 2, the clock signal CLK is a signal having a period of T and a duty ratio of 50%, in which a cycle A represents operation in a reading out mode and a cycle B represents operation in a writing mode. While the clock signal CLK is held at "LOW" level, before rising of the clock signal CLK, the address signal ADj and the write enable bar signal WEB are established. Namely, signal variation of the address signal ADj is completed up to a timing defined by an address set up time tas before rising of the clock signal CLK. Signal variation of the write enable bar signal WEB is completed up to a timing defined by a write enable bar set up time tws.

When the clock signal CLK is "LOW" level, the precharge control signal PC is "HIGH" level, all digit line pair is precharged. On the other hand, when the clock signal CLK is risen into be "HIGH" level, the precharge control signal PC turns into "LOW" level to terminate precharge operation. Also, after turning the clock signal CLK into "HIGH" level, the word line is selected by the row address signal in the address signal ADj.

Hereinafter, operation in the read out mode (cycle A) is discussed. At first, the clock signal CLK turns into "LOW" level. Next, all of the digit line pairs are precharged. Then, address signal ADj and write enable bar signal WEB are established. Subsequently, the clock signal is risen to be "HIGH" level. Thereafter, precharge is terminated. Then, the word line signal WLS[k] is risen to be "HIGH" level. Thereafter, the read out data output signal OUT[i] is output.

On the other hand, discussion will be given in the write mode (cycle B) hereinafter. At first, the clock signal CLK turns into "LOW" level. Then, all of the digit line pairs are precharged. Thereafter, the clock signal is risen to be "HIGH" level. Then, precharging is terminated. Then, the selected word line signal WLS[k] is risen to be "HIGH" level. Then, write data input signal IN[i] is input.

Thus, in the first prior art, before rising the clock signal CLK, precharging of all of the digit line pairs is completed. Accordingly, a time tacc (access time) from a timing where the clock signal CLK is risen to a timing where the data is output as the read out data output signal OUT[i] does not include the precharge period. Therefore, access time tacc can be shortened. Such SRAM is generally applied for the circuits intended for high speed operation.

However, in the foregoing first prior art, while the clock signal CLK is "LOW" level, namely before the address is established, all of the digit line pairs are precharged. Accordingly, non-selected digit line pairs are precharged. As a result, necessary power consumption for precharging is increased. For example, in case of the SRAM having 1088 words×24 bits designed under 0.5 μm rule, a ratio of the necessary power consumption for precharging reaches about 50% per overall power consumption.

A semiconductor device designed for lowering power consumption is disclosed in Japanese Examined Patent Publication (Kokoku) No. Heisei 2-146183. Hereinafter, this will be referred to as "second prior art". FIG. 3 is a block diagram showing a construction of the semiconductor device of the second prior art. The second prior art shown in FIG. 3 is differentiated from the first prior art only in that a precharge decoder 101 is further provided. In FIG. 3, like elements to those in FIG. 1 will be identified by like reference numerals and detailed discussion will be neglected.

As shown in FIG. 3, the address signal AD and a signal output from the address latch 130 are input to the precharge decoder 101. A signal output from the precharge decoder 101 is input to the precharge driver 102.

In the second prior art constructed as set forth above, the precharge decoder 101 selects only circuit for performing precharging for the digit line pair selected by column select in accordance with the address signal AD and the signal output from the address latch 130. Accordingly, precharging becomes possible only for the digit line pair selected by the address signal AD. As a result, when the construction of SRAM is eight columns construction, the second prior art can reduce power consumption for precharging to be one eighth of the first prior art.

However, the semiconductor device of the second prior art, a potential difference between complementary digit lines forming a non-selected digit line pair is increased up to about power source voltage Vdd at maximum. By this, the following problems can be encountered.

FIG. 4 is a block diagram showing an operation of a function block of one bit upon writing, and FIG. 5 is a block diagram showing an operation of a function block of one bit upon reading. The function block shown in Fig.4 and 5 is a part of single port SRAM having eight columns construction.

As shown in FIG. 4 and 5, in each of the RAM cell blocks 120, digit line pairs 160a, 160b, . . . 160g and 160h are arranged in column, and word lines WL[1], WL[2], . . . WL[(m/8)−1] and WL[m/8] are arranged in row. The RAM cells connected to the digit lines and the word lines are arranged at respective positions where the digit line pairs and the word lines intersect. It should be noted that, in FIGS. 4 and 5, the RAM cell at the position where the digit line pair 160x (x=a to h) and the word line WL[y] (y=1 to (m/8)) intersect will be expressed as RM(x, WL[y]).

The precharge control signals PC[1], PC[2], . . . , PC[7] and PC[8] output from the precharge driver 102 are input to respective prechargers 100a, 100b, . . . 100g and 100h forming precharger unit 100. Then, current is supplied to respective digit line pairs from respective prechargers on the basis of these signals.

On the other hand, the other ends of the digit line pairs 160a, 160b, . . . , 160g and 160h are connected to column selectors 140a, 140b, . . . , 140g and 140h forming the column selector unit 140. Column address input signals SEL[1:8] output from the column decoder 141 are input to respective column selectors.

FIG. 4 shows a condition where data is written in the RAM cell RM(a, WL[1]). Namely, the digit line pair 160a is selected by inputting the column address input signal SEL[1] to the column selector unit 140a. In conjunction therewith, the word line WL[1] is selected by the word line signal WLS. By this, a write data input signal IN input to the write driver 151 is written in the RAM cell RM(a, WL[1]).

On the other hand, FIG. 5 shows a condition for reading out the data stored in the RAM cell RM(g, WL[m/8]). Namely, upon reading out, by selection of the digit line pair 160g and the word line WL[m/8], a holding data stored in the RAM cell RM(g, WL[m/8]) is output as a read out data output signal OUT via the sense amplifier 150.

FIG. 6 is a chart showing waveforms illustrating an operation in the case where writing operation shown in FIG. 4 and reading operation shown in FIG. 5 are performed sequentially. When writing operation shown in a cycle C and reading operation shown in a cycle D are sequentially performed, the digit line pair 160a selected in the cycle C is not selected in the subsequent cycle D. Accordingly, the digit line pair 160a is not precharged. As a result, between complementary digit lines forming the digit line pair 160a, a potential difference provided upon writing operation in the cycle C may be maintained in the cycle D.

At this time, when the RAM cell RM(a, WL[m/8]) connected to non-selected digit line pair 160a and selected word line WL[m/8] holds data opposite to the data written in the cycle C, the held data of the RAM cell RM(a, WL[m/8]) can be reversed by potential difference residing between complementary digit lines forming the digit line pair 160a.

Also, as set forth above, when the digit line pair selected in the writing mode is not selected in the next cycle, the potential difference upon writing can be maintained between the complementary digit lines forming the selected digit line pair in the writing mode. Accordingly, data of the RAM cell connected to the digit line pair and the word line selected in the next cycle, can be broken by the residual potential difference.

Furthermore, when the predetermined word line is selected for a long period, namely, when RAM cell RM(b, WL[1]), . . . RAM cell RM(h, WL[1]) connected to the word line WL[1] and digit line pairs 160b to 160h are sequentially selected in FIG. 4, for example, the potential difference between the complementary digit lines forming the non-selected digit line pair 160a is increased. By this, the data in the RAM cell RM(a, WL[1]) connected to the non-selected digit line pair 160a can be destroyed.

Furthermore, in the predetermined digit line pair, even when the word line connected to the RAM cell holding the same data are sequentially selected, the potential difference between the complementary digit lines forming the predetermined digit line pair can be increased. By this, the data of the RAM cell holding the data opposite to that held in the sequentially selected RAM cell and connected to the predetermined digit line pair, can be destroyed.

As set forth above, while the problem to be caused in the conventional semiconductor device has been discussed in terms of synchronous SRAM, the similar problem may be caused in asynchronous SRAM.

SUMMARY OF THE INVENTION

It is therefore an object of the present invention to provide a static type semiconductor memory device which can be stabilized in operation of a device.

A static-type semiconductor memory device, according to the present invention, has a RAM cell block, precharging circuit and equalizing circuit. The RAM cell block includes a plurality of digit line pairs, a plurality of word lines and a plurality of RAM cells connected to the digit line pairs and the word lines for storing data. Each of the digit line pairs is consisted of complementary digit lines. The precharging circuit precharges only for predetermined digit line pair selected among a plurality of digit line pairs by a column address input signal. The equalizing circuit equalizes potential of complementary digit lines forming all of digit line pairs at equal potential during a period which the predetermined digit line pair is not precharged.

It is preferred that the equalizing circuit operates at least once within a reading operation cycle reading out data from the RAM cell and a writing operation cycle writing data in the RAM cell. Thus, potential of the complementary digit lines forming all of digit line pairs are equalized to be the equal potential, respectively.

On the other hand, the precharging circuit may include a precharger for precharging the predetermined digit line pair, a precharge driver for driving the precharger and a precharge decoder for determining an operation timing of the precharger. Also, the equalizing circuit may include an equalizer for equalizing potential of the complementary digit lines forming the predetermined digit line pair and an equalizer driver for driving the equalizer.

Furthermore, the equalizing circuit may further include a controller for determining operation timing of the equalizer.

In the present invention, during a period other than a period for precharging the selected predetermined digit line pair, the potential of all of the complementary digit lines are equalized to be equal potential by the equalizing circuit. Accordingly, the potential difference between the digit lines forming non-selected digit line pairs can be reduced to the level not inverting the data stored in the RAM cell. Accordingly, destroying of memory data stored in the RAM cell can be prevented. As a result, power consumption of the semiconductor memory cell is lowered to stabilize operation of the device.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENTS

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscure the present invention.

Figure 1:
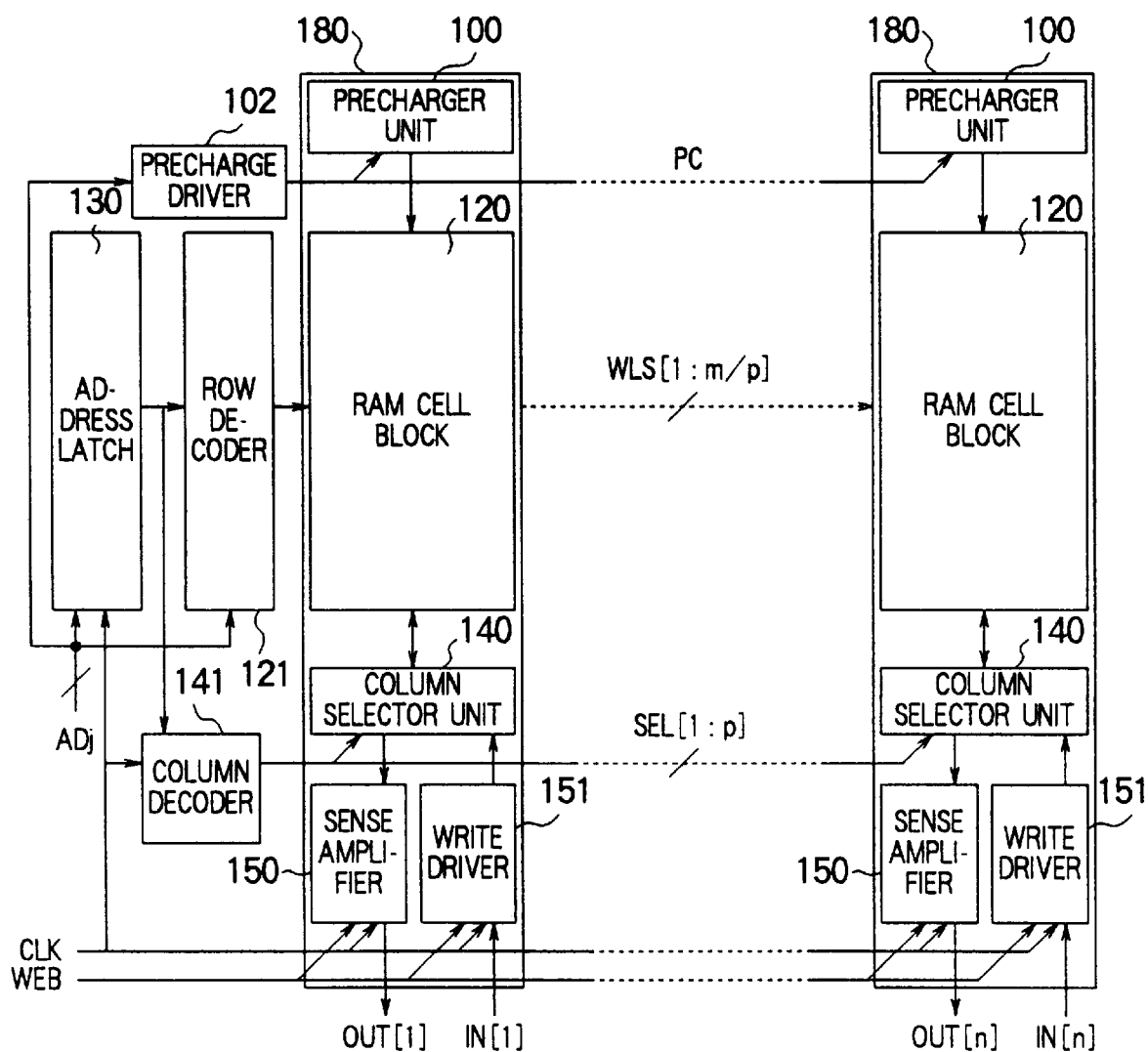
FIG. 1 is a block diagram showing an example of construction of the conventional synchronous single port SRAM.
Figure 2:
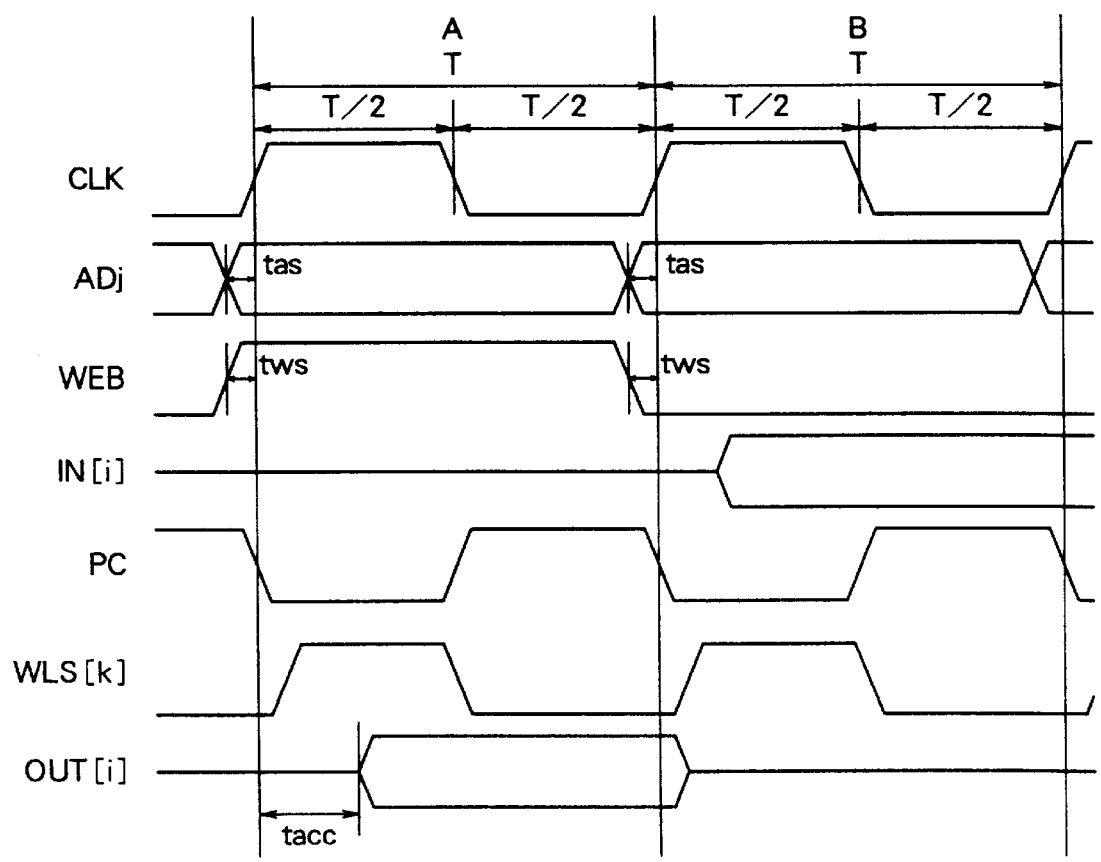
FIG. 2 is a chart showing waveforms of an example of operation of the SRAM of the first prior art.
Figure 3:
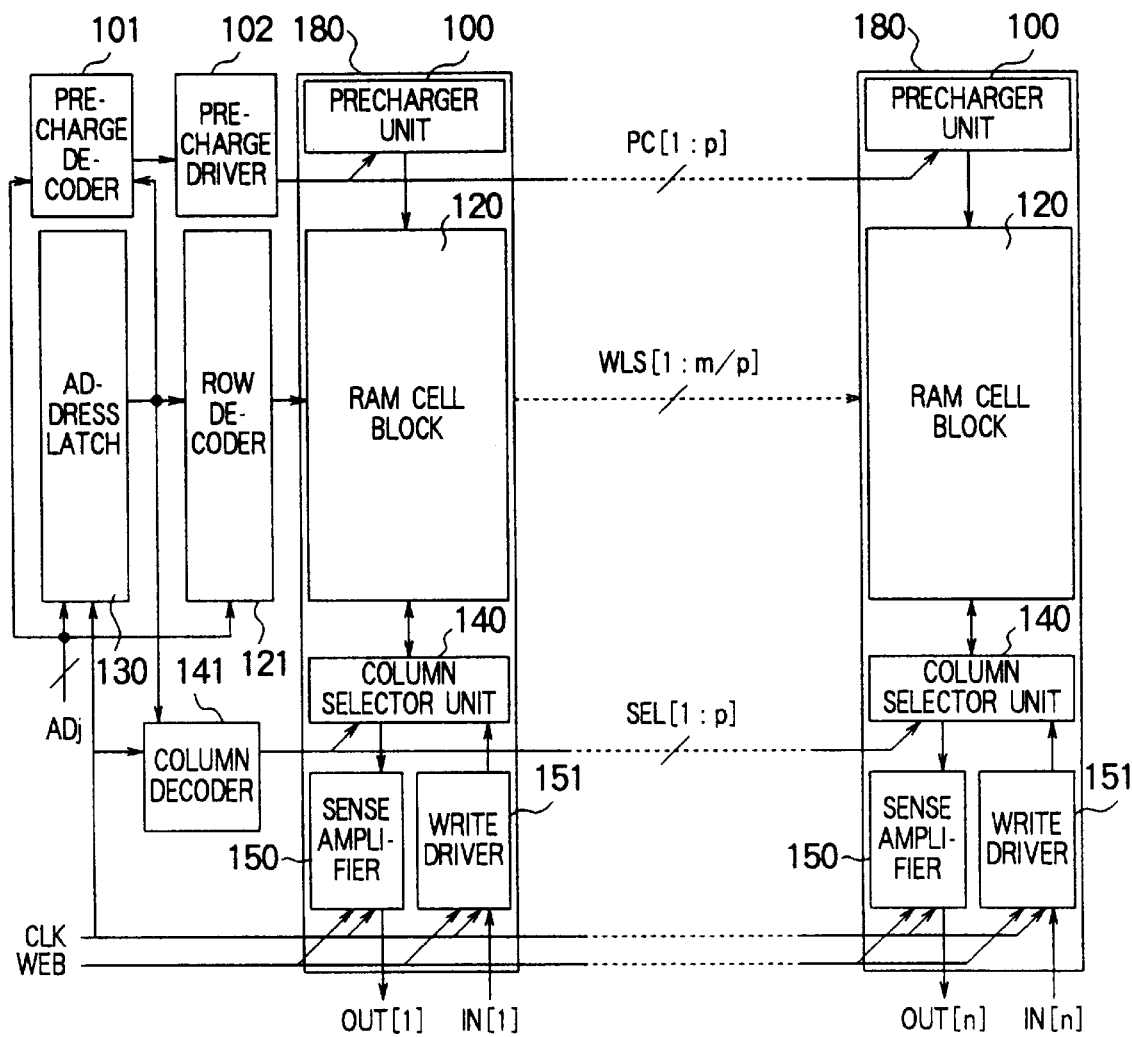
FIG. 3 is a block diagram showing a construction of the semiconductor device of the second prior art.
Figure 4:
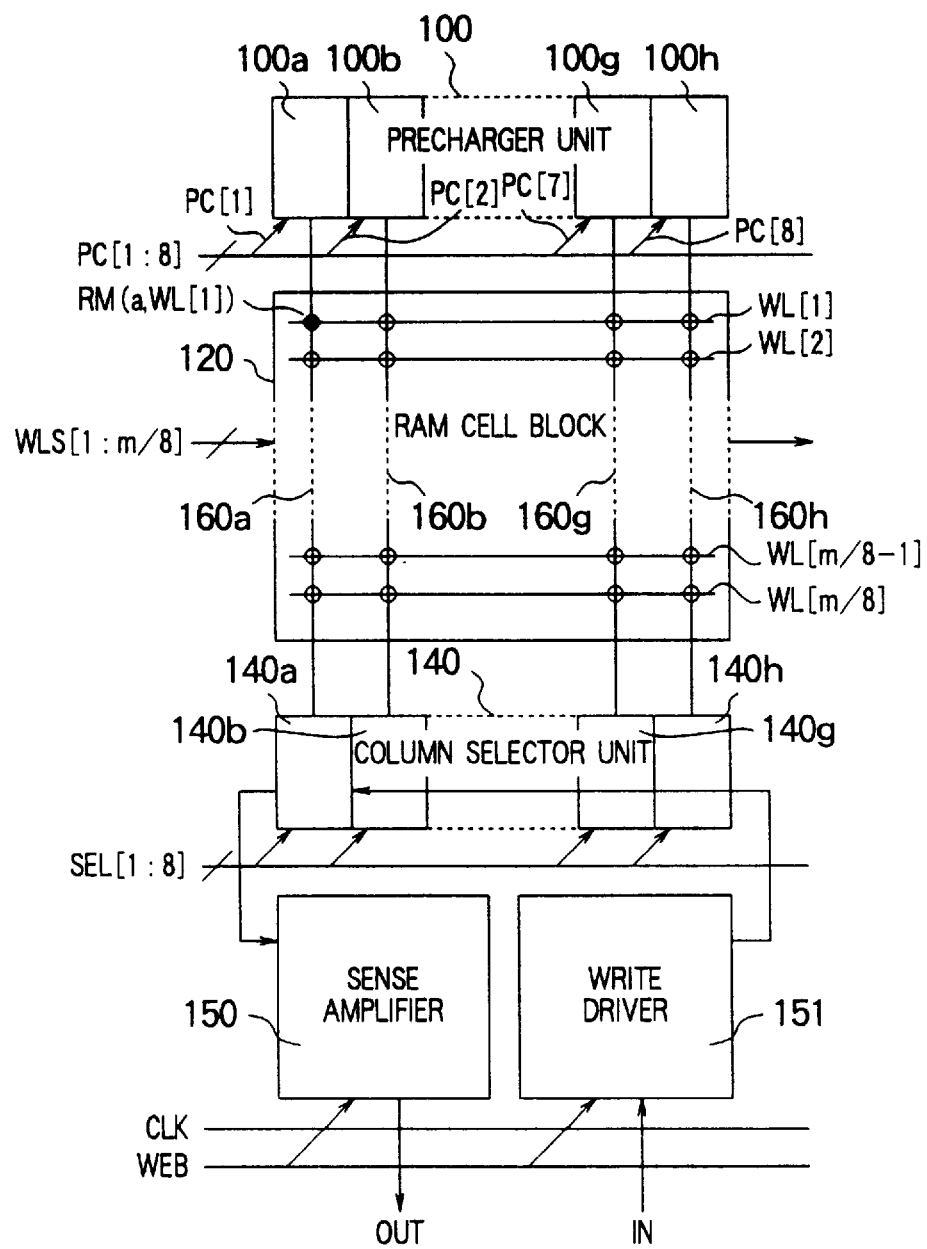
FIG. 4 is a block diagram showing an operation of a function block of one bit upon writing.
Figure 5:
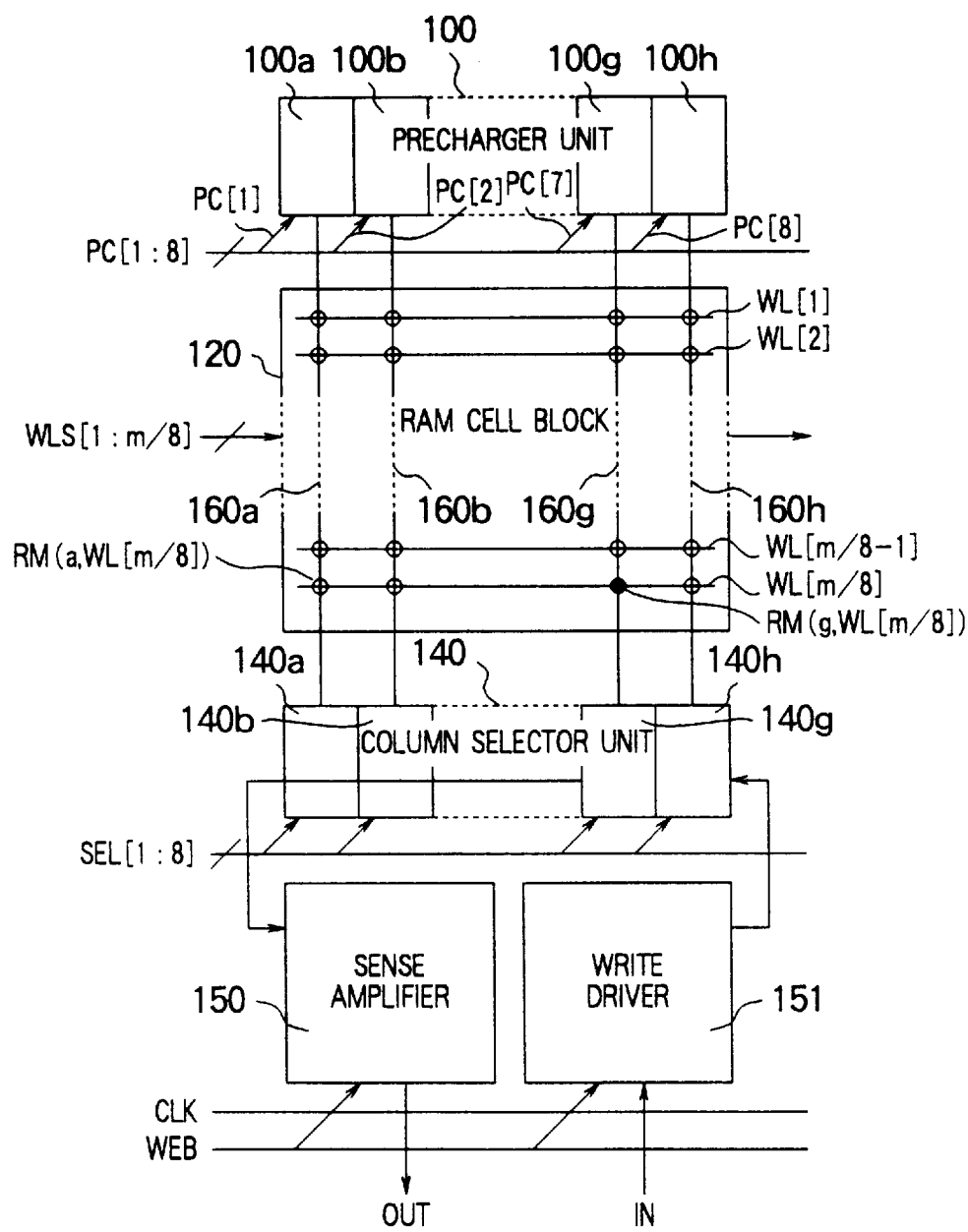
FIG. 5 is a block diagram showing an operation of a function block of one bit upon reading.
Figure 6:
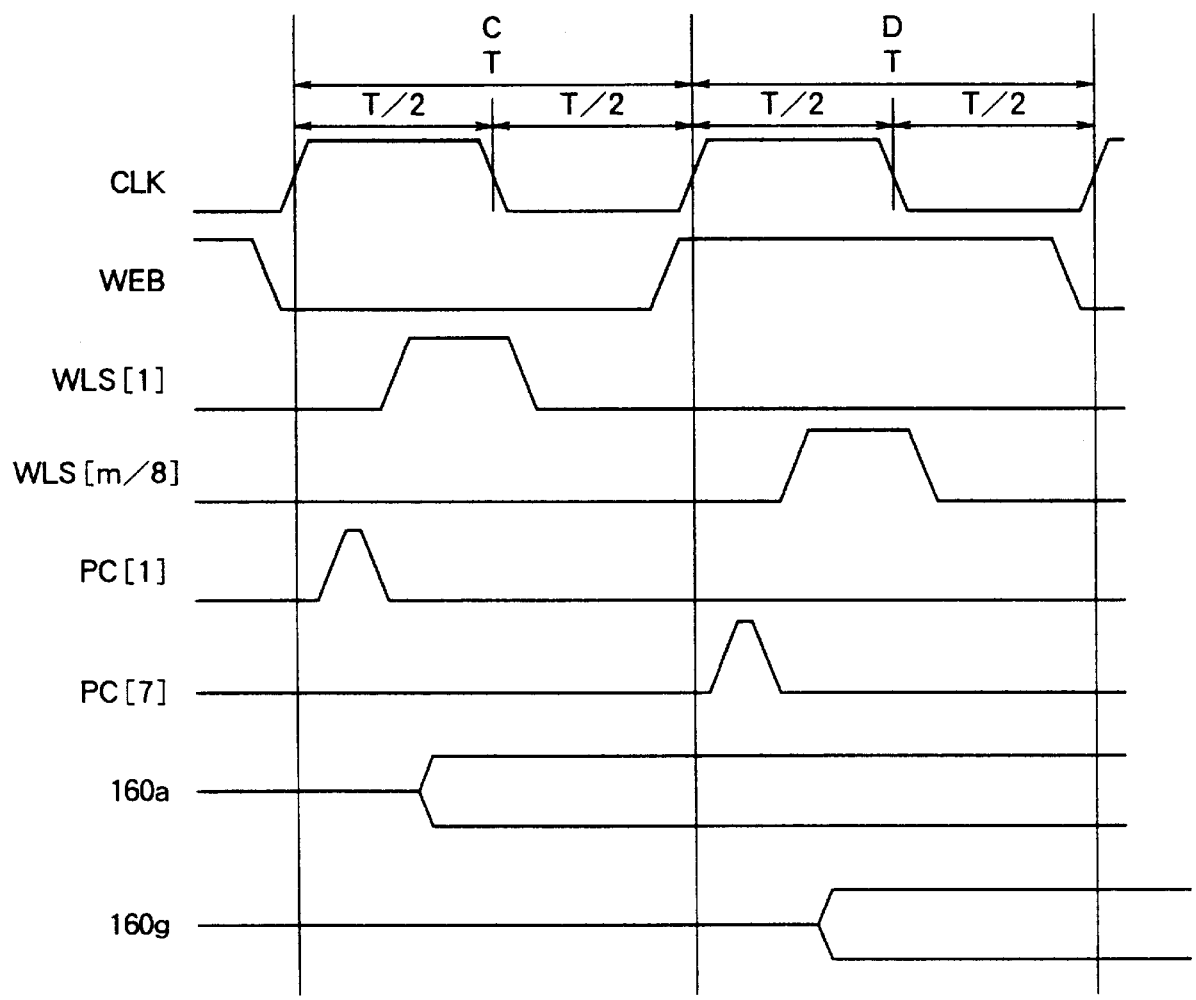
FIG. 6 is a chart showing waveforms illustrating an operation in the case where the writing operation shown in FIG. 4 and the reading operation shown in FIG. 5 are performed sequentially.
Figure 7:
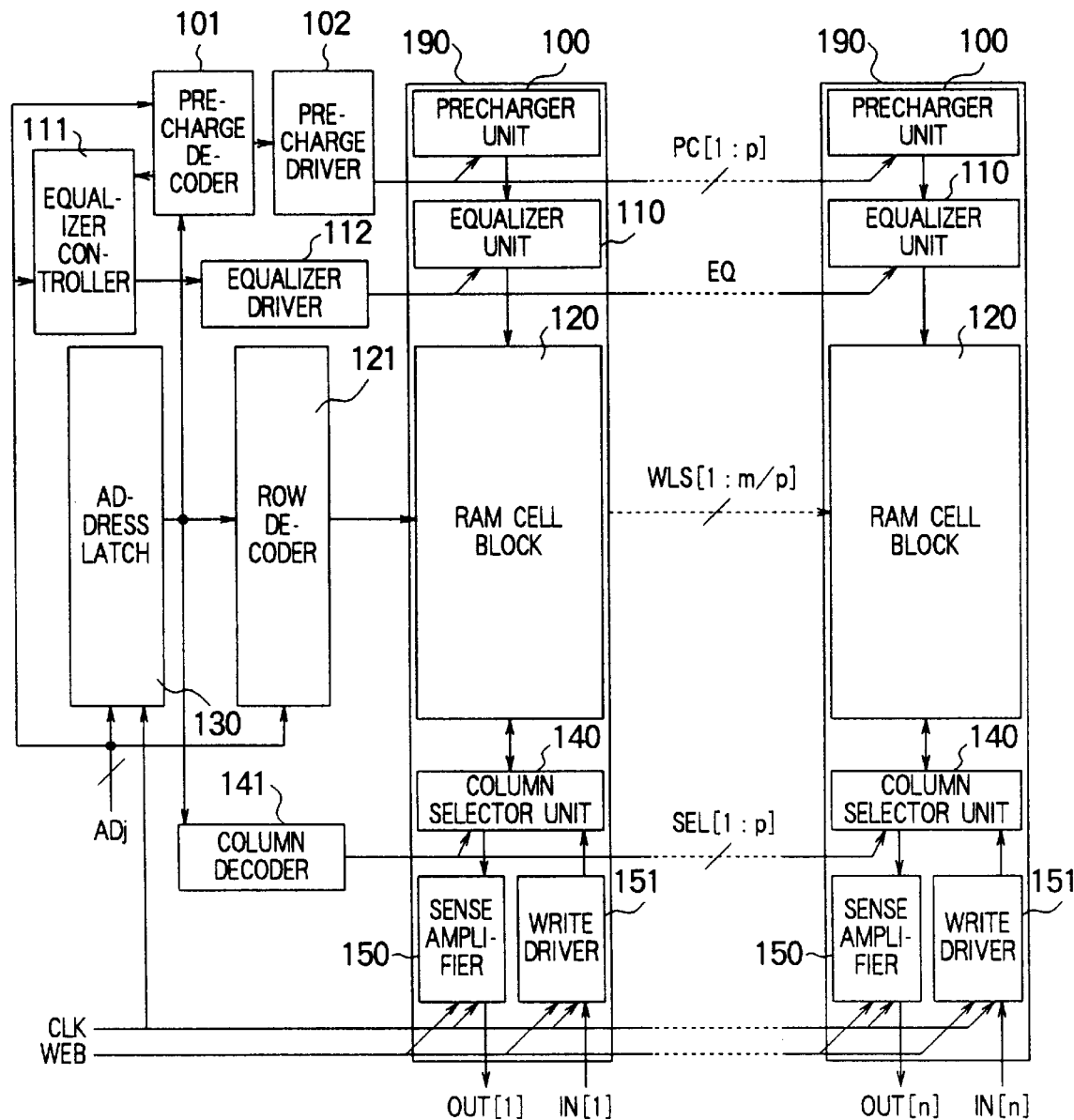
FIG. 7 is a block diagram showing a construction of the first embodiment of a semiconductor memory device according to the present invention.

FIG. 7 is a block diagram showing a construction of the first embodiment of a semiconductor memory device according to the present invention. The semiconductor memory device shown in FIG. 7 is a synchronous SRAM of m words×n bits, and p column (m, n and p are natural number). Namely, the SRAM has n in number of function blocks 190 with taking one bit as one unit, an address latch 130, a row decoder 121 for determining selection of word lines, a column decoder 141 for determining selection of a digit line pair, an equalizer controller 111, an equalizer driver 112, a precharge decoder 101 and a precharge driver 102. Also, the function block 190 includes RAM cell block 120, column selector unit 140 for selecting one set of digit line pair among p sets of digit line pairs, precharger unit 100, sense amplifier 150, write driver 151 and equalizer unit 110 equalizing potential of complementary digit lines forming the digit line pair at equal potential. Each RAM cell block 120 is constructed with digit line pairs, word lines and a plurality of RAM cells arranged in matrix fashion of p×(m/p).

A clock signal CLK is input to an address latch 130, and sense amplifier 150 and write driver 151 in the function block 190. An address signal AD is input to the address latch 130, the equalizer controller 111, the precharge decoder 101 and row decoder 121. A signal output from the address latch 130 is input to the row decoder 121, the precharge decoder 101 and the column decoder 141.

A signal output from the precharge decoder 101 is input to the equalizer controller 111. In conjunction therewith, the signals are input to precharger units 100 in respective function blocks 190 as precharge control signals PC[1:p]. A signal output from the equalizer driver 112 serves as an equalizer control signal EQ and input to the equalizer units 110 in respective function blocks 190. Word line signals WLS[1:m/p] output from the row decoder 121 are signals selecting the word line and are input the RAM cell blocks 120 in the function blocks 190.

Column address input signals SEL[1:p] output from the column decoder 141 are input to respective column selector units 140 in the function blocks 190. Also, a write enable bar signal WEB is input to respective sense amplifiers 150 and respective write drivers 151 of the function blocks 190.

In the function block 190, a write data input signal IN is input to the RAM cell block 120 via the write driver 151 and the column selector unit 140. On the other hand, a read out data output signal OUT output from the RAM cell block 120 is externally output via the column selector unit 140 and sense amplifier 150. The precharger unit 100 supplies current to digit line pair of the RAM cell block 120 via equalizer unit 110 in response to the precharge control signals PC[1:p].

Figure 8:
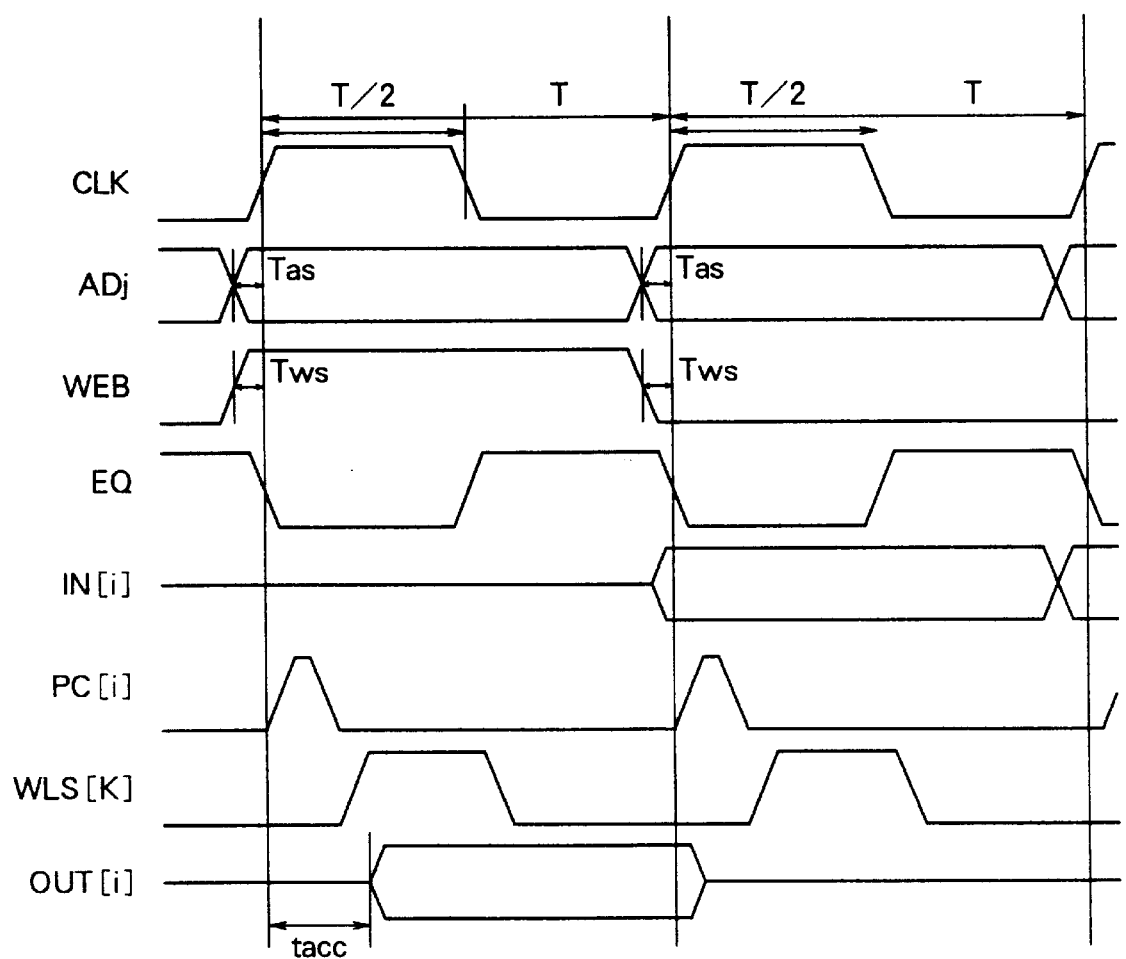
FIG. 8 is a chart showing waveforms of an operation of the first embodiment of the semiconductor memory device.

Operation of the semiconductor memory device constructed as set forth above will be discussed hereinafter. FIG. 8 is a chart showing waveforms of an operation of the first embodiment of the semiconductor memory device. In FIG. 8, the clock signal CLK, the address signal ADj ($1 \leq j \leq [\log_2(m)]+1$), the write enable bar signal WEB and the write data input signal IN[i] ($1 \leq i \leq n$) are shown as input signals. As an output signal, the read out data output signal OUT[i] is shown. Also, as internal signals, the equalizer control signal EQ, the precharge control signal PC[i] and a word line signal WLS[k] ($1 \leq k \leq (m/p)$) are shown.

In FIG. 8, the clock signal CLK is a signal having a period of T and a duty ratio of 50%. The address signal ADj and the write enable bar signal WEB are established before rising of the clock signal CLK. Namely, signal variation of the address signal ADj is completed up to a timing defined by an address set up time tas before rising of the clock signal CLK. Signal variation of the write enable bar signal WEB is completed up to a timing defined by a write enable bar set up time tws.

Also, the precharge control signal PC[i] is varied after rising of the clock signal CLK to activate only precharger connected to the digit line pair selected by column selection. By this, only selected digit line pair is precharged. When the equalizer control signal EQ is "HIGH" level, the potentials of the complementary digit lines are equalized by the equalizer unit 110.

Hereinafter, operation in the read out mode is discussed. At first, the word line signal WLS[k] turns into "LOW" level. Next, the equalizer control signal EQ turns into "HIGH" level to initiate equalizing operation. Subsequently, the clock signal CLK is risen to be "HIGH" level. Subsequently, the equalizer control signal EQ turns into "LOW" level to terminate equalizing operation. Then, precharging for the selected digit line pair is initiated. Thereafter, precharging is completed. Then, the word line signal WLS[k] is risen to be "HIGH" level. Thereafter, the read out data output signal OUT[i] is output.

On the other hand, discussion will be given in the write mode hereinafter. At first, the word line signal WLS[k] turns into "LOW" level. Next, the equalizer control signal EQ turns into "HIGH" level to initiate equalizing operation. Subsequently, the clock signal CLK is risen to be "HIGH" level. Then, the equalizer control signal EQ turns into "LOW" level to terminate equalizing operation. Subsequently, precharging for the selected digit line pair is initiated. Thereafter, precharging is completed. Then, the word line signal WLS[k] is risen to be "HIGH" level. Then, write data input signal IN[i] is input.

If the digit line pair is not precharged at the writing mode, the following operation may be selected. At first, the word line signal WLS[k] turns into "LOW" level. Next, the equalizer control signal EQ turns into "HIGH" level to initiate equalizing operation. Subsequently, the clock signal CLK is risen to be "HIGH" level. Then, the equalizer control signal EQ turns into "LOW" level to terminate equalizing operation. Then, the word line signal WLS[k] is risen to be "HIGH" level. Then, write data input signal IN[i] is input.

Figure 9:
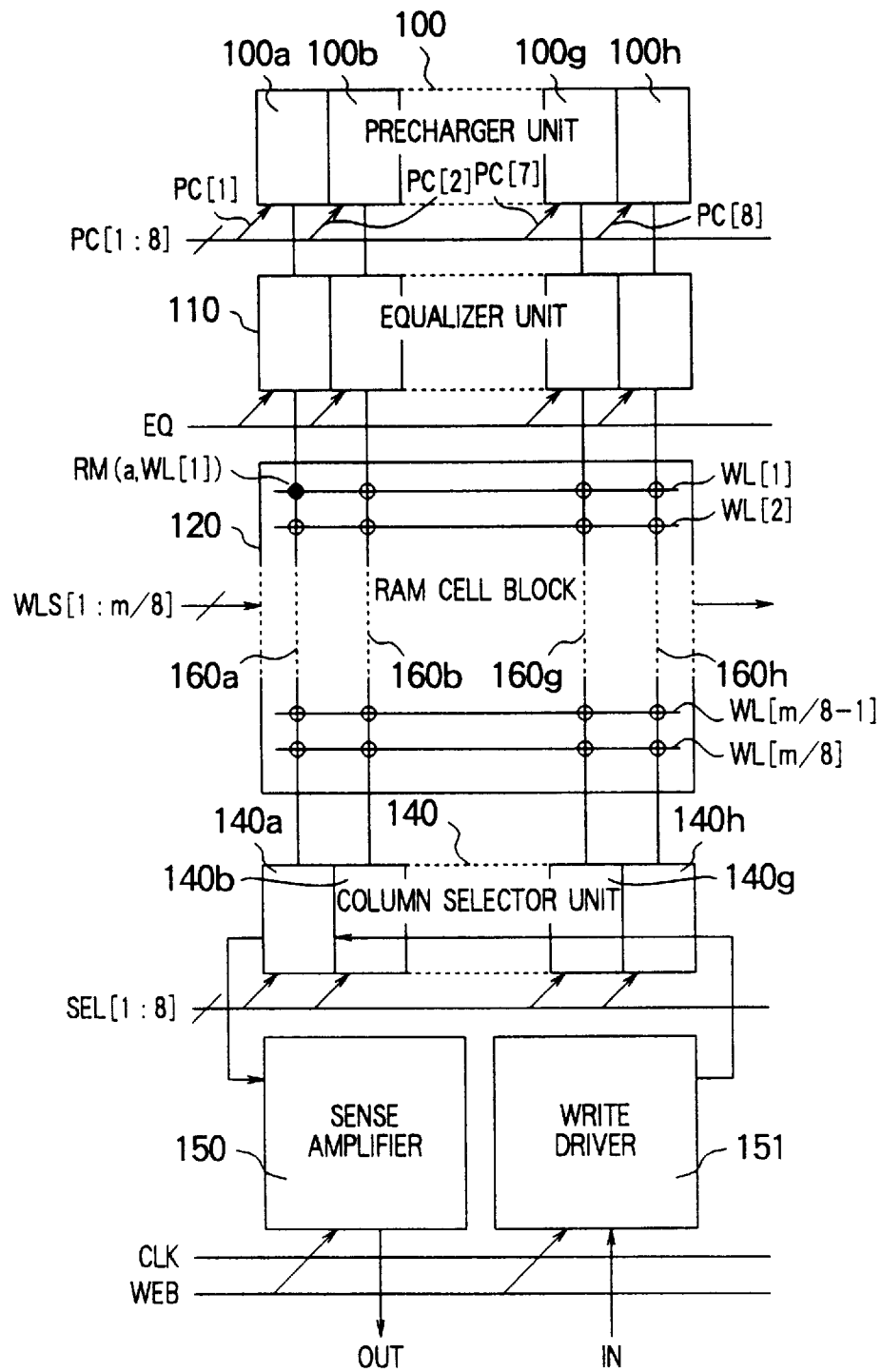
FIG. 9 is a block diagram showing an operation of the function block of one bit upon writing.
Figure 10:
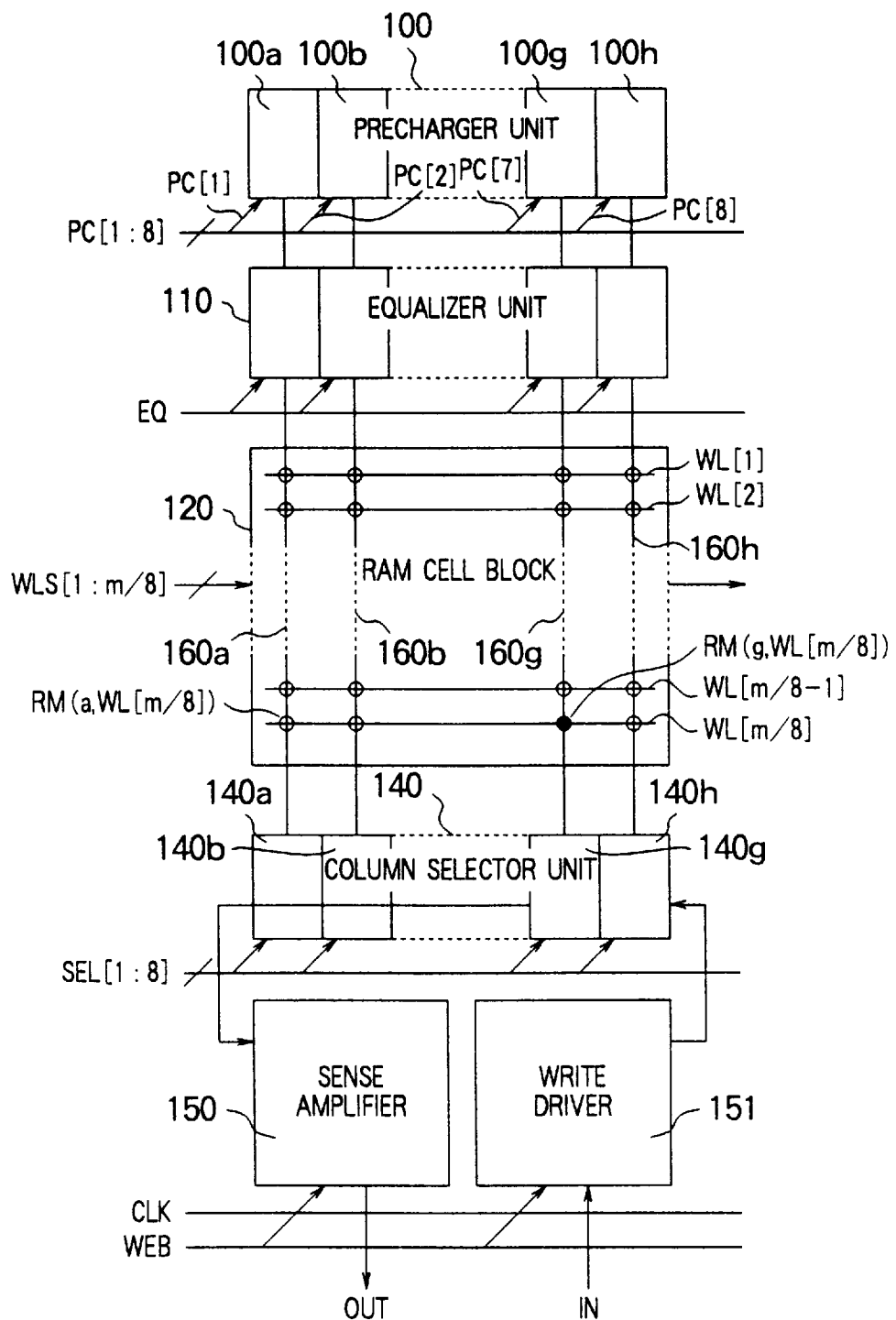
FIG. 10 is a block diagram showing an operation of the function block of one bit upon reading.

FIG. 9 is a block diagram showing an operation of the function block of one bit upon writing, and FIG. 10 is a block diagram showing an operation of the function block of one bit upon reading. It should be noted that, the function blocks shown in FIGS. 9 and 10 have eight columns construction.

As shown in FIG. 9 and 10, in each of the RAM cell block 120, digit line pairs 160a, 160b, . . . 160g and 160h are arranged in column, and word lines WL[1], WL[2], . . . WL[(m/8)−1] and WL[m/8] are arranged in row. At respective positions where the digit line pairs and the word lines intersect, the RAM cells connected to the digit lines and the word lines are arranged. It should be noted that, in FIGS. 9 and 10, the RAM cell at the position where the digit line pair 160x (x=a to h) and the word line WL[y] (y=1 to (m/8)) intersect will be expressed as RM(x, WL[Y]).

The precharge control signals PC[1], PC[2], . . . PC[7] and PC[8] output from the precharge driver 102 are input to respective prechargers 100a, 100b, . . . 100g and 100h forming precharger unit 100. Signals output from respective prechargers are input to respective digit line pairs via respective equalizers forming the equalizer unit 110.

On the other hand, the other ends of the digit line pairs 160a, 160b, . . . , 160g and 160h are connected to column selectors 140a, 140b, . . . , 140g and 140h forming the column selector unit 140. Column address input signals SEL[1:8] output from the column decoder 141 are input to respective column selectors.

FIG. 9 shows a condition where data is written in the RAM cell RM(a, WL[1]). Namely, the digit line pair 160a is selected by inputting the column address input signal SEL to the column selector unit 140. In conjunction therewith, the word line WL[1] is selected by the word line signal WLS. By this, the write data input signal IN input to the write driver 151 is written in the RAM cell RM(a, WL[1]).

On the other hand, FIG. 10 shows a condition for reading out the data stored in the RAM cell RM(g, WL[m/8]). Namely, a holding data stored in the RAM cell RM(g, WL[m/8]) is output as a read out data output signal OUT via the sense amplifier 150 upon reading out, by selection of the digit line pair 160g and the word line WL[m/8].

Figure 11:
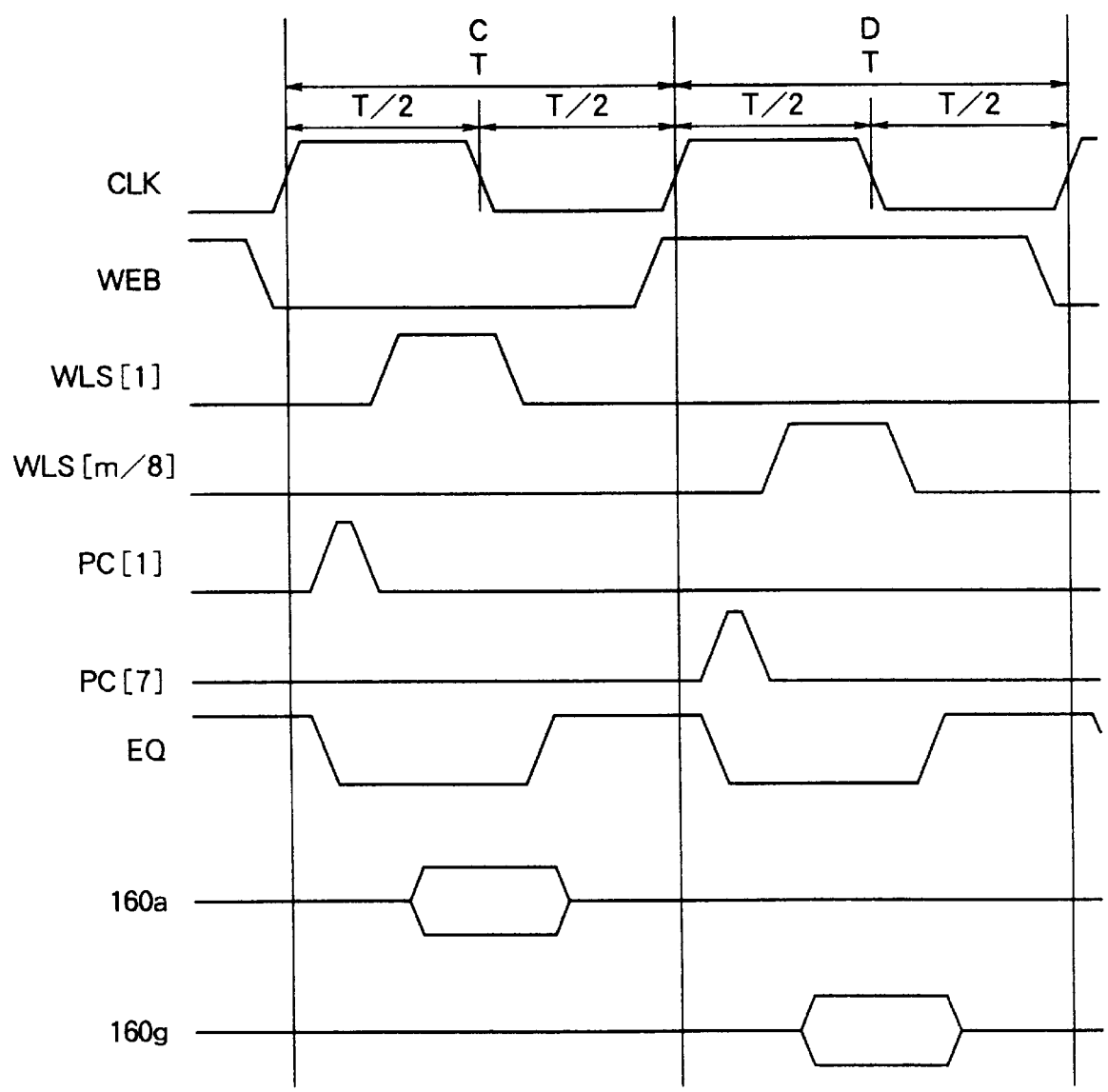
FIG. 11 is a chart showing waveforms illustrating an operation in the case where the writing operation shown in FIG. 9 and the reading operation shown in FIG. 10 are performed sequentially.

FIG. 11 is a chart showing waveforms illustrating an operation in the case where writing operation shown in FIG. 9 and reading operation shown in FIG. 10 are performed sequentially. When writing operation shown in a cycle C and reading operation shown in a cycle D are sequentially performed, potentials of the complementary digit lines forming the digit line pair 160a selected at cycle C are equalized by the equalizer control signal EQ until the next cycle D. Accordingly, even when the RAM cell RM(a, WL[m/8]) has opposite data to that of the RAM cell RM(a, WL[1]), the potential difference between the complementary digit lines of the digit line pair 160a can be reduced. As a result, inversion of data of the RAM cell RM(a, WL[m/8]) can be successfully prevented.

As set forth above, in the shown embodiment, after completion of writing operation, before initiation of next reading operation or writing operation, the potential between all of the complementary digit line pairs can be equalized respectively. Accordingly, destroying of held data in the RAM cell will never be caused to stabilize operation of the semiconductor memory device. Also, since only selected digit line pair is precharged, power consumption can be reduced.

Figure 12:
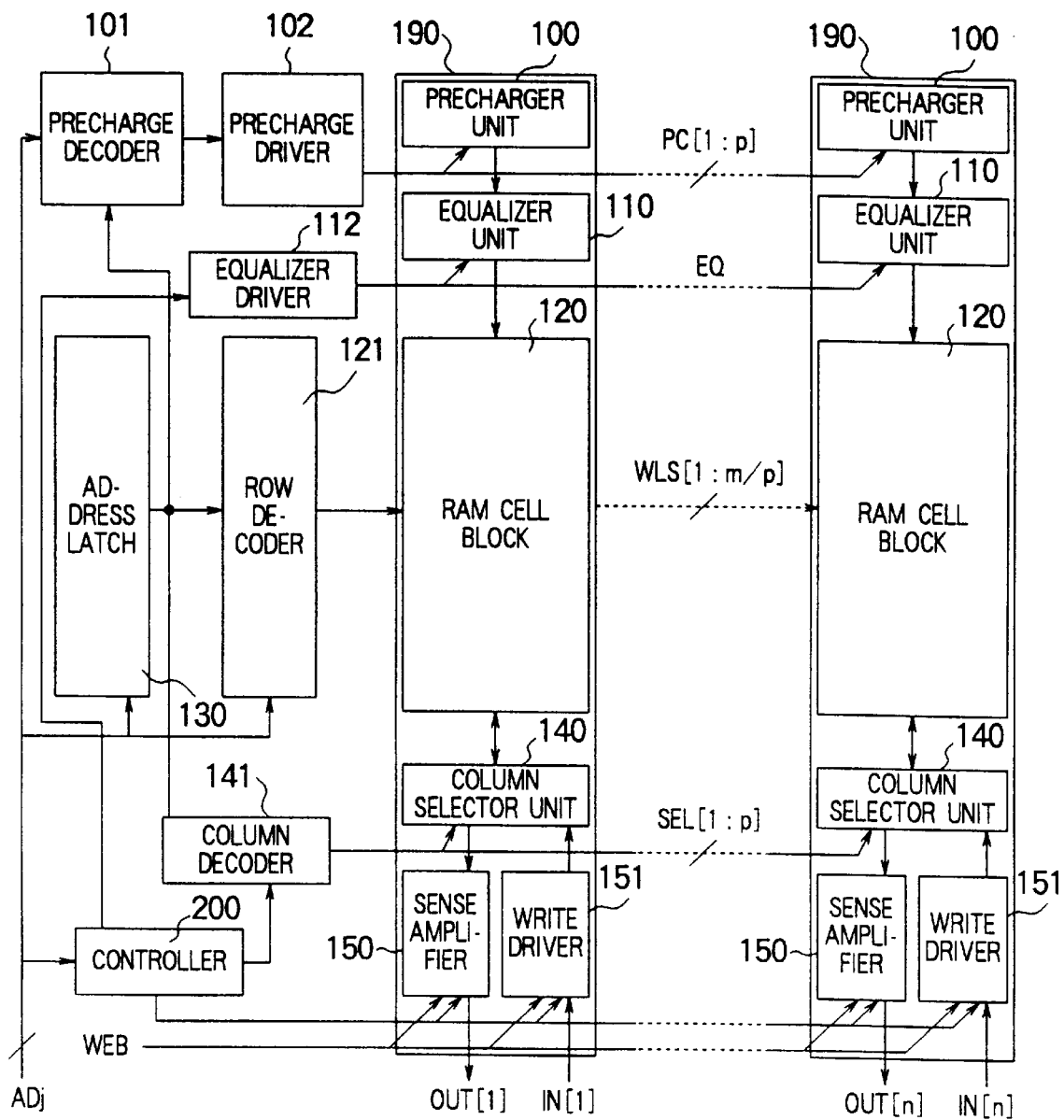
FIG. 12 is a block diagram showing a construction of the second embodiment of a semiconductor memory device according to the present invention.

FIG. 12 is a block diagram showing a construction of the second embodiment of the semiconductor memory device according to the present invention. As shown in FIG. 12, the shown semiconductor memory device is an asynchronous single port SRAM having construction of m words×n bits, p columns (m, n and p are natural numbers). The second embodiment shown in FIG. 12 is differentiated from the first embodiment, in that a controller 200 is provided in place of the equalizer controller 111. Accordingly, in FIG. 12, like elements to those in FIG. 7 will be identified by like reference numerals and detailed description for common components will be neglected for keeping the disclosure simple enough for facilitating clear understanding of the present invention.

In the second embodiment, the address signal AD is input to the controller 200, the address latch 130, the row decoder 121 and the precharge decoder 101. A signal output from the controller 200 is input to the equalizer driver 112 and the column decoder 141, and the sense amplifier 150 and the writer driver 151 in the function block 190. Thus, in the second embodiment, the controller 200 outputs an internal signal to control respective block in the SRAM circuit. The equalizer driver 112 is also controlled by the controller 200, directly.

Figure 13:
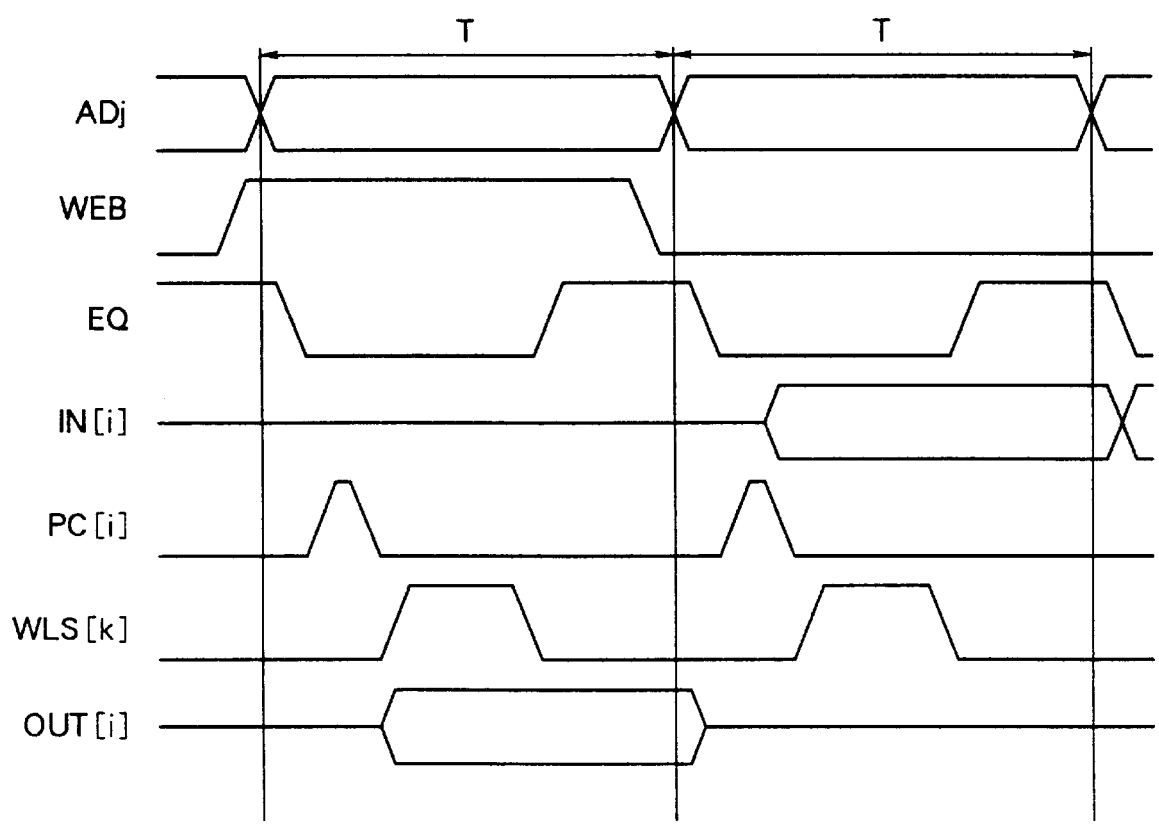
FIG. 13 is a chart showing waveforms of operation of the second embodiment of the semiconductor memory device.

Operation of the second embodiment of the semiconductor memory device constructed as set forth above will be discussed hereinafter. FIG. 13 is a chart showing waveforms of operation of the second embodiment of the semiconductor memory device. In FIG. 13, the address signal ADj, the write enable bar signal WEB and the write data input signal IN[i] are shown as input signals. As an output signal, the read out data output signal OUT[i] is shown. Also, as internal signals, the equalizer control signal EQ, the precharge control signal PC[i] and a word line signal WLS[k] are shown.

Hereinafter, operation at the read out mode is discussed. At first, the word line signal WLS[k] turns into "LOW" level. Next, the equalizer control signal EQ turns into "HIGH" level to initiate equalizing operation. Subsequently, the address signal ADj is input to respective circuits. Subsequently, the equalizer control signal EQ turns into "LOW" level to terminate equalizing operation. Then, precharging for the selected digit line pair is initiated. Thereafter, precharging is completed. Then, the word line signal WLS[k] is risen to be "HIGH" level. Thereafter, the read out data output signal OUT[i] is output.

On the other hand, discussion will be given in the write mode hereinafter. At first, the word line signal WLS[k] turns into "LOW" level. Next, the equalizer control signal EQ turns into "HIGH" level to initiate equalizing operation. Subsequently, the address signal ADj is input to respective circuits. Then, the equalizer control signal EQ turns into "LOW" level to terminate equalizing operation. Subsequently, precharging for the selected digit line pair is initiated. Thereafter, precharging is completed. Then, the word line signal WLS[k] is risen to be "HIGH" level. Then, write data input signal IN[i] is input.

If the digit line pair is not precharged at the writing mode, the following operation may be selected. At first, the word line signal WLS[k] turns into "LOW" level. Next, the equalizer control signal EQ turns into "HIGH" level to initiate equalizing operation. Subsequently, the address signal ADj is input to respective circuits. Then, the equalizer control signal EQ turns into "LOW" level to terminate equalizing operation. Then, the word line signal WLS[k] is risen to be "HIGH" level. Then, write data input signal IN[i] is input.

Even in the second embodiment, when the data is read out from the RAM cell RM(g, WL[m/8]) in the reading operation after writing of data in the RAM cell RM(a, WL[1]), equalizing operation is performed for all of the digit line pairs. Accordingly, similarly to the first embodiment, the potentials of the complementary digit lines forming the digit line pair 160a are equalized. By this, even when the RAM cell RM(a, WL[m/8]) connected to non-selected digit line pair 160a holds the opposite data to that held in the RAM cell RM(a, WL[1]), the data in the RAM cell RM(a, WL[m/8]) will never be destroyed.

As set forth, even in the asynchronous SRAM, after completion of writing operation, before initiation of next reading operation or writing operation, the potentials between all complementary digit lines are equalized. Therefore, the held data of the RAM cells will never be destroyed to successfully stabilize operation of the semiconductor memory device.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

For instance, the semiconductor memory device according to the invention may be applicable for a multiport SRAM for obtaining equivalent effect.

What is claimed is:

1. A static-type semiconductor memory device comprising:
    a RAM cell block including a plurality of digit line pairs each of which includes complementary digit lines, a plurality of word lines and a plurality of RAM cells connected to said digit line pairs and said word lines for storing data;
    a precharging circuit for precharging only a predetermined digit line pair selected from among a plurality of digit line pairs by a column address input signal; and
    an equalizing circuit for equalizing a potential of said complementary digit lines forming said plurality of digit line pairs at equal potential during a period when said predetermined digit line pair is not precharged.

2. A semiconductor memory device as set forth in claim 1, wherein said equalizing circuit operates at least once within a reading operation cycle reading out data from said RAM cell and a writing operation cycle writing data in said RAM cell to equalize potential of said complementary digit lines forming all of digit line pairs.

3. A semiconductor memory device as set forth in claim 1, wherein said precharging circuit includes a precharger for precharging said predetermined digit line pair, a precharge driver for driving said precharger and a precharge decoder for determining an operation timing of said precharger.

4. A semiconductor memory device as set forth in claim 1, wherein said equalizing circuit includes an equalizer for equalizing potential of said complementary digit lines forming all of digit line pairs and an equalizer driver for driving said equalizer.

5. A semiconductor memory device as set forth in claim 4, wherein said equalizing circuit further includes a controller for determining operation timing of said equalizer.

6. A semiconductor memory device as set forth in claim 1, wherein said predetermined digit line pair includes two digit lines connected to a same one of said plurality of RAM cells.

* * * * *